United States Patent
Knapp et al.

(10) Patent No.: US 9,667,357 B2
(45) Date of Patent: May 30, 2017

(54) MILLIMETER-WAVE TRANSMITTER ON A CHIP, METHOD OF CALIBRATION THEREOF AND MILLIMETER-WAVE POWER SENSOR ON A CHIP

(71) Applicant: Infineon Technologies AG, Neubiberg (DE)

(72) Inventors: Herbert Knapp, Munich (DE); Jonas Wursthorn, Sankt Johann-Wurtingen (DE)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 14/262,727

(22) Filed: Apr. 26, 2014

(65) Prior Publication Data
US 2015/0309091 A1    Oct. 29, 2015

(51) Int. Cl.
  H04B 17/10   (2015.01)
  G01R 21/12   (2006.01)
  G01R 19/00   (2006.01)
  G01R 21/00   (2006.01)

(52) U.S. Cl.
  CPC ........... *H04B 17/102* (2015.01); *G01R 21/12* (2013.01); *G01R 19/00* (2013.01); *G01R 19/0084* (2013.01); *G01R 19/0092* (2013.01); *G01R 21/00* (2013.01)

(58) Field of Classification Search
  CPC  G01R 19/0092; G01R 19/0084; G01R 21/00; G01R 19/00; G01R 19/165
  USPC ....................................... 324/76.11
  See application file for complete search history.

(56) References Cited

U.S. PATENT DOCUMENTS

| | | | | |
|---|---|---|---|---|
| 3,988,928 A | * | 11/1976 | Edstrom | G01P 5/10 73/204.19 |
| 4,008,610 A | | 2/1977 | Larsen et al. | |
| 4,835,059 A | * | 5/1989 | Kodato | G01L 1/2293 136/258 |
| 5,204,613 A | * | 4/1993 | Cripps | G01R 21/10 324/119 |

(Continued)

FOREIGN PATENT DOCUMENTS

CN    1366616    8/2002

OTHER PUBLICATIONS

Lee, Jangjoon; Bhagavatula, Srikar ; Roy, K. ; Byunghoo Jung; Variation-aware and self-healing design methodology for a system-on-chip; in Test Workshop (LATW), 2012 13th Latin American , vol., No., pp. 1-4, 10-13 Apr. 2012.*

Lee, Jangjoon, et al. "Variation-aware and self-healing design methodology for a system-on-chip." 2012 13th Latin American Test Workshop (LATW). IEEE, 2012.*

(Continued)

*Primary Examiner* — Jermele M Hollington
*Assistant Examiner* — Christopher McAndrew
(74) *Attorney, Agent, or Firm* — Schiff Hardin LLP

(57) ABSTRACT

The present invention relates to a millimeter-wave transmitter on a chip comprising at least one transmit path coupleable to an oscillator, and an on-chip power sensor to measure at least a portion of a transmit power transmitted over the at least one transmit path. The present invention further relates to a method of calibrating a millimeter-wave transmitter on a chip and an on-chip power sensor coupleable to at least one transmit path of a millimeter-wave transmitter. The embodiments of the present invention provide a direct measure of transmit power provided within an individual one of the transmit paths of the millimeter-wave transmitter.

25 Claims, 8 Drawing Sheets

(56) References Cited

U.S. PATENT DOCUMENTS

| | | | |
|---|---|---|---|
| 6,292,140 B1 | 9/2001 | Osterman | |
| 7,061,738 B2* | 6/2006 | Fey | H02H 9/008 |
| | | | 361/91.6 |
| 7,283,921 B2* | 10/2007 | Chandwani | H05K 7/186 |
| | | | 374/100 |
| 7,411,552 B2* | 8/2008 | King | B65D 5/4233 |
| | | | 340/572.1 |
| 7,548,053 B2 | 6/2009 | Morf et al. | |
| 8,311,760 B2* | 11/2012 | Hohe | G01D 3/0365 |
| | | | 324/207.12 |
| 2003/0151869 A1* | 8/2003 | Fey | H02H 9/008 |
| | | | 361/91.1 |
| 2007/0138574 A1* | 6/2007 | Eikyu | H01L 21/28114 |
| | | | 257/384 |
| 2010/0217556 A1* | 8/2010 | Hohe | G01D 3/0365 |
| | | | 702/104 |
| 2011/0174978 A1 | 7/2011 | Forg et al. | |
| 2014/0098030 A1* | 4/2014 | Tang | G06F 3/0414 |
| | | | 345/173 |

OTHER PUBLICATIONS

Strohm, K. M., et al. "Millimeter wave transmitter and receiver circuits on high resistivity silicon." Microwave and Millimetre Wave Monolithic Integrated Circuits, IEE Colloquium on. IET, 1988.*

Koh, Kwang-Jin, Jason W. May, and Gabriel M. Rebeiz. "A millimeter-wave (40-45 GHz) 16-element phased-array transmitter in 0.18-m SiGe BiCMOS technology." IEEE Journal of Solid-State Circuits 44.5 (2009): 1498-1509.*

Agilent Technologies, "Fundamentals of RF and Microwave Power Measurements (AN 64-1A)", Part No. 5989-6255EN, Revision Date Jun. 1998.

Agilent Technologies, Inc., "Choosing the Right Power Meter and Sensor", 2007,2008 Printed in USA, Feb. 28, 2008.

Institute for Technical Electronics, "Design of Integrated Power Sensors for Microwave", thesis by Christoph Hammerl dated Oct. 31, 2012 (English translated with Google Translate).

Office Action dated Mar. 20, 2017 for Chinese Patent Application No. 201510364015.0.

* cited by examiner

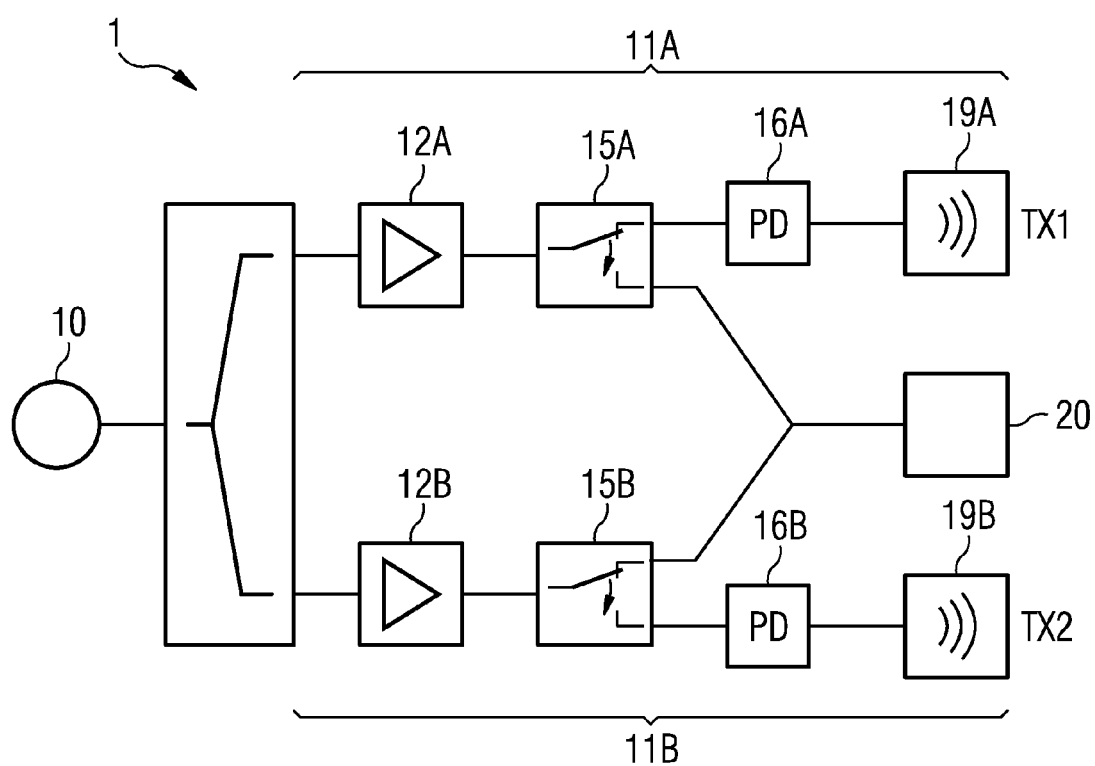

MILLIMETER-WAVE TRANSMITTER ON A CHIP, METHOD OF CALIBRATION THEREOF AND MILLIMETER-WAVE POWER SENSOR ON A CHIP

TECHNICAL FIELD

The present application relates to a millimeter-wave transmitter on a chip, a method of calibrating such a millimeter-wave transmitter and an on-chip power sensor for use in the millimeter-wave transmitter according to the present invention.

U.S. Pat. No. 6,292,140 discloses an antenna which is used for the manufacture of bolometer integrated on a silicon chip. The bolometer comprises an opening in the silicon chip, the opening is spanned by two separate thermally isolated structures. A thin-film antenna comprising two parts, is located on the structures with one antenna part on each structure. Radiation received in the larger of the two antenna parts is coupled electromagnetically into the smaller part where it caused a current to flow. A thin-film thermometer measures the temperatures rise of the smaller antenna part, due to the dissipated heat. The bolometer achieves improved performance in comparison to previous bolometer designs because the variation is dissipated in a part of the antenna only and the bolometer is free from impedance-matching constrains of other designs.

US-Patent Application 2011/0174978 A1 discloses a thermal infrared sensor provided in a housing with optics and a chip with thermal elements on a membrane. The membrane spans a frame-shaped support body that is a good heat conductor, and the support body has vertical or approximately vertical balls. The object is to provide a thermal pile infrared sensor in monolithic silicium micro-machining technology, wherein the infrared sensor has a high thermal resolution capacitor with a small chip size, a high degree of filling and high response rate. The thermal part sensor structure consists of a few long thermal elements per sensor cell. The thermal elements being arranged on connecting webs that connect together hot contacts on an absorber layer to cold contacts of the thermal elements. A membrane is suspended by one or more connecting webs and has, on both sides of the long thermal elements, narrow slits that separate the connecting webs from both the control region and also the support body.

U.S. Pat. No. 4,008,610 discloses a self-balancing D.C.-substitution R.F. power measuring system with first and second high gained differential operational amplifiers, a bolometer element, and a reference resistor element. The amplifiers and the two elements are connected in a current loop with one of the elements connected between the output terminals from the differential amplifiers and the other of the elements connected between center points of isolated dual power supplies associated with each of the amplifiers. Current flows out of one amplifier and into the other. The current is driven to a value which maintains the potential between the input terminus of the first amplifier essential equal to zero and a potential between the input terminals of the second amplifier essentially equal to zero. Thus, the current drives the value of the bolometer elements to a resistance which is equal to the resistance of the reference element.

U.S. Pat. No. 7,548,053 B2 discloses a wide-band antenna coupled spectrometer using CMOS transistors. To create a broad band spectrometer, a plurality of individual antenna based bolometers are fabricated on the surface of a single spectrometric chip, each bolometer having an individual antenna which is sized differently from all others, thus being responsive to a generally unique frequency of radiation. Each antenna is coupled to a related transistor, which his easily formed using CMOS technology. The antennas are connected to opposite sides of a transistor gate, thus creating a termination resistor for the particular antenna. Multiple outputs from the various antennas are then coupled, thus providing responsiveness to electromagnetic radiation of a very broad spectrum.

FIG. 1 shows a method of calibrating a millimeter-wave transmitter according to the prior art. On the left-hand side a transmitting path terminating at an antenna element TX is displayed, the transmit path receives the RF input from the left, while a directional coupler singles-out a portion of the RF in-power which is directed to a diode. The diode is a rather coarse device for measuring a transmit power. In particular for pulsating RF power a diode typically only responds to maximum amplitudes within such a signal. Hence, the diode will not provide a reliable measure for an average transmit power directed towards the diode. The diode will produce a voltage depending on the maximum amplitude of RF power reaching the diode. Typically the diode has a characteristic as displayed in FIG. 1 on the right-hand side. The voltage Vs across the diode varies with the actual transmit-power TX according to the characteristic shown.

In order to reliably measure the (peak) power reaching the diode, it is typically necessary to measure the transmit-power TX directly and use the voltage Vs to correlate the voltage measured across the diode to the transmit-power actually transmitted at the antenna element terminating the transmit path. When implementing such a calibration of the RF output power in the transmit direction, one may determine the peak RF power delivered to the antenna element by evaluating the voltage Vs of the diode.

A drawback of such a calibrating scheme is that it is rather complex. For example, a signal around 77 GHz needs to be measured with expensive and fragile RF equipment such as probes, wave-guides, power meters, potentially comprising frequency extenders, and the like.

A setup of such a calibration scheme further requires knowledge about RF technology and is rather time consuming. It is further to be understood, that there is no means of recalibrating the diode shown in FIG. 1, once the system with the antenna elements is already being used. This is due to the fact, that in the application the actual transmit path is connected to an antenna. For recalibration of the diode-based sensor, the antenna has to be replaced by an RF power meter which is difficult if not impossible for most applications.

The present invention aims at improving the above mentioned drawbacks of the prior art.

The present invention discloses a millimeter-wave transmitter on a chip. The millimeter-wave transmitter according to one embodiment comprises at least one transmit path coupleable to a millimeter-wave transmitter, and an on-chip power sensor. The at least one transmit path may be coupled to the oscillator. The on-chip power sensor is adapted to measure at least a portion of a transmit power transmitted over the at least one transmit path.

The millimeter-wave transmitter according to the present invention may without any limitation be part of a millimeter-wave transceiver. Therefore the term millimeter-wave transmitter as used in the following description may be construed as reference to a mere millimeter-wave transmitter or a millimeter-wave transceiver, alike.

Aspects of the millimeter-wave transmitter according to the invention may be of interest in the field of radar systems or wireless communication systems, but is not limited thereto.

According to a further embodiment the on-chip power sensor may be coupled to an individual one of the transmit paths via a directional coupler or via a power splitter.

According to another embodiment the individual one of the at least one transmit path may be terminated by an antenna element or an on-chip termination.

According to yet another embodiment, the individual one of the at least one transmit path comprises an amplifier and/or an on-chip power estimator.

For the millimeter-wave transmitter according to another embodiment the at least one transmit path may comprise an amplifier and/or an on-chip power estimator.

According to a further embodiment the oscillator may be a voltage controlled oscillator.

The millimeter-wave transmitter according to another embodiment may comprise a selected one of the at least one transmit path comprising a switch for selectively coupling the selected one of the at least one transmit path to the on-chip power sensor.

According to yet another embodiment the on-chip power sensor of the millimeter-wave transmitter may be implemented as a layer.

According to yet another embodiment of the millimeter-wave transmitter, the on-chip power sensor may be implemented as a resistor formed on a layer within the chip.

According to yet another embodiment of the millimeter-wave transmitter, the layer may be implemented as a silicide polysilicon layer used to connect a base region of a plurality of transistors within the chip.

According to yet another embodiment of the millimeter-wave transmitter, the layer may be a layer used to implement base contact layers of transistors within the chip.

According to another embodiment of the millimeter-wave transmitter, the resistor forming the power sensor may be implemented as a temperature dependent resistor.

According to another embodiment of the millimeter-wave transmitter, the oscillator may be a voltage controlled oscillator.

The invention further discloses a method of calibrating a millimeter-wave transmitter on a chip. Such a calibration method may be of interest for millimeter-wave transmitters in radar systems or wireless communication systems, alike but is not limited thereto.

The method comprises a step of providing transmit power within at least one transmit path of the millimeter-wave transmitter. The method may further comprise a directing step of directing at least a portion of the provided transmit power to a power sensor on the chip. The method may further comprise a step of measuring the portion of the provided transmit power at the power sensor on the chip.

According to another embodiment the method may comprise a step of calibrating a power estimator within the at least one transmit path in response to the measured portion.

The directing step may according to a further embodiment of the method be such that there are time periods when the portion of the provided transmit power directed to the power sensor substantially vanishes. This is to say that the transmit power may comprise time periods with vanishing amplitude or substantially vanishing amplitude.

The invention further discloses an on-chip power sensor coupleable to at least one transmit path of a millimeter-wave transmitter. The on-chip power sensor may comprise a resistor formed in a layer of the chip wherein the resistance of the resistor varies over temperature.

According to yet another embodiment the on-chip power sensor may further comprise a capacitor coupled in series to the resistor.

According to yet another embodiment the on-chip power sensor may further comprise a quarter wave-length section and a second capacitor coupled to the resistor.

According to yet another embodiment of the on-chip power sensor the resistor may be formed by a material deposited within a layer of the chip.

According to yet another embodiment the layer may comprise at least one base contact of a plurality of transistors within the chip.

BRIEF DESCRIPTION OF THE DRAWINGS

FIG. 2C shows a further embodiment of the millimeter-wave transmitter according to the present invention.

DETAILED DESCRIPTION OF THE DRAWINGS

Figure 2A:
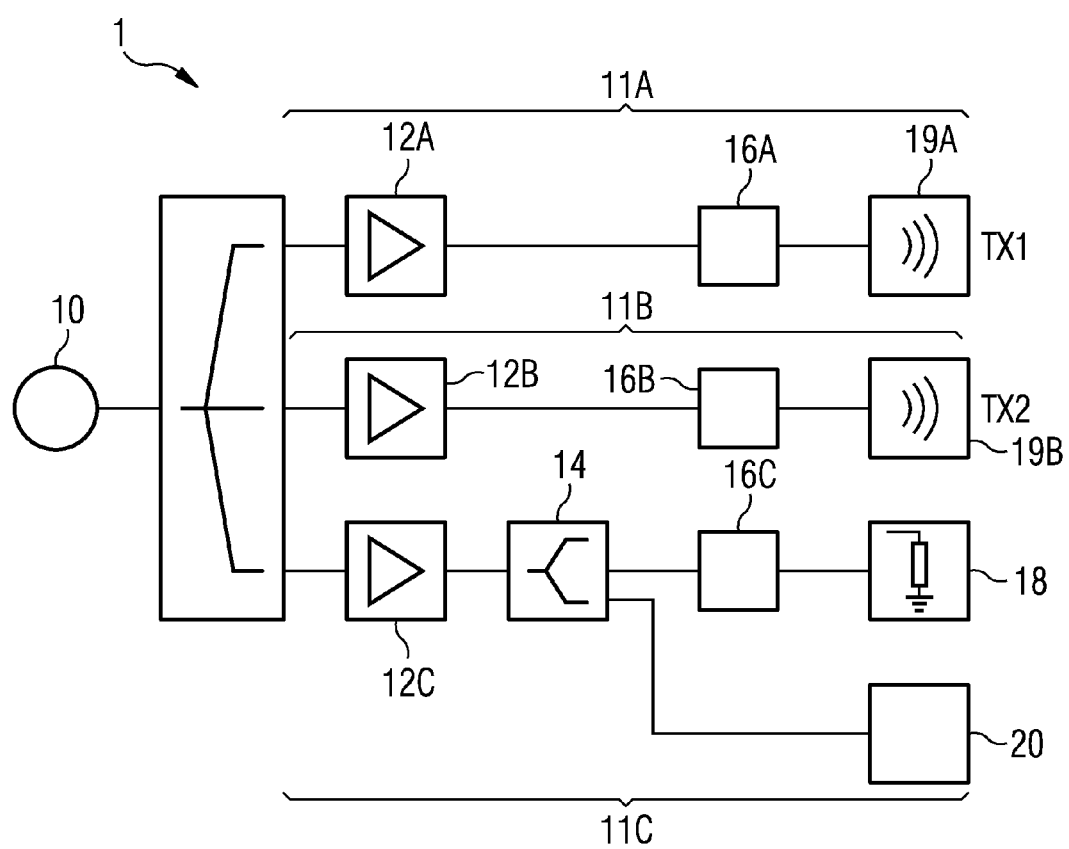
FIG. 2A shows a millimeter-wave transmitter according to the present invention.

FIG. 2A shows a first embodiment of the millimeter-wave transmitter according to the invention. The millimeter-wave transmitter 1 comprises an oscillator 10, a first transmit path 11A and a second transmit path 11B, together with a calibration path 11C. The oscillator 10 may without limitation be a voltage regulated oscillator. The oscillator 10 may provide millimeter-waves being forwarded to a power divider, which may without a limitation be a 1:n power divider.

The power divider typically provides a defined ratio of incoming power to n-times a fraction thereof at the output side. So the input power provided by the oscillator 10 is typically equally distributed between outputs of the divider. Coupled to each output of the divider there may be the first transmit path 11A, the second transmit path 11B, and a calibration path 11C, which is a variant of the transmit path 11A, 11B. Each of the paths may comprise an amplifier 12A, 12B, 12C, as known in the art. Each of the transmit paths 11A, 11B, and the calibrating path 11C may comprise a power estimator 16A, 16B, 16C. The power estimator 16A, 16B, 16C may typically be implemented as a diode-based estimator. Without limitation other implementations are known to the person skilled in the art. Typically the power estimator 16A, 16B, 16C will only provide a relative and/or coarse measure for the transmit power TX1, TX2 transmitted at respective antenna elements 19A, 19B of the first and second transmit paths 11A, 11B.

However, implementing the power estimator 16A, 16B as the diode-based estimator may have some drawbacks. For example, the power measurement provided by the power estimator 16A, 16B, may only be responsive to maximum power amplitudes forwarded to the power transmitter. Furthermore, individual ones of the power estimator 16A, 16B, 16C, while responding already to the rather low power levels, will vary for each of the individual ones. This is partly due to difficulties of matching the power estimator 16A, 16B, 16C, implemented as a diode to an impedance of the 50 Ohm along the individual transmit path 11A, 11B. Hence, the transmit power in forward direction estimated by the power estimators 16A, 16B, 16C may be considered a representation of the actual transmit power TX1, TX2 delivered to the individual antenna elements 19A, 19B.

Within the calibration path 11C according to the present invention, there may be a power splitter 14 present. The power splitter 14 may be implemented as a Wilkinson power splitter, a circulator, also known as a rat race coupler or a directional coupler. A person of ordinary skill in the art will readily appreciate that the power splitter 14 may alternatively or additionally make use of a capacitive coupling. The power splitter 14 may extract a certain portion of the forward transmit power provided downstream the amplifier 12C within the calibration path 11C to an on-chip power sensor 20. Different to the power estimator 16A, 16B, 16C, the on-chip power sensor 20 will respond to a higher RF power range with sufficient sensitivity. Therefore the on-chip power sensor 20 requires the higher RF power range compared to the power estimator 16A, 16B, 16C in order to provide a sufficiently accurate measurement of the RF power directed to the on-chip power sensor 20.

It may therefore be of interest for the power splitter 14 to provide a large enough portion, say as non-limiting example 50% of the total forward transmit power delivered to the calibration path 11C.

As may be seen from FIG. 2A, the calibration path 11C may fork out into the on-chip power sensor 20 in one branch and the on-chip termination 18 in a further branch. The on-chip termination 18 may be of interest in order to provide the required impedance, for example 50Ω, along the calibration path 11C. Providing the on-chip power sensor 20 in combination with on chip termination 18 may be of interest in order to allow for precise transmit power levels to be measured directly.

It may be of interest to implement the on-chip power sensor 20 as a material layer within a stack of layers of the chip. It may be further of interest to implement the on-chip power sensor 20 as a material layer within one of the layers of the chip, for example, as a structured layer of a material. In particular it may be of interest to provide the power sensor 20 as a material layer that is deposited anyway within the named layer of the chip.

Such an implementation of the on-chip power sensor 20 may be of advantage, as no further processing steps will be required in order to implement the on-chip power sensor 20. It may be of interest to use a material for the on-chip power sensor 20 that shows a measureable temperature dependence, say a temperature dependence of a resistance. The temperature dependence may be, for example, described by a positive temperature coefficient or a negative temperature coefficient. Suppose the portion of the transmit power singled out at the power splitter 14 reaches the on-chip power sensor 20. The on-chip power sensor 20 may yield a resistivity value that changes depending on the RF power delivered to the on-chip power sensor 20. As mentioned before the on-chip power sensor 20 may be formed as the temperature dependent resistor implemented as the material layer within the chip.

A person of ordinary skill in the art will readily understand that there will be a certain time required for the on-chip power sensor 20 to be heated-up by the portion of the transmit power and accordingly change its resistivity value which now yields a direct measure of the transmit power forwarded along an individual one of the transmit paths 11A, 11B and the calibration path 11C.

In order to give an estimate for the transmit power TX forwarded along the calibration path 11C, one needs to know the ratio according to which the power splitter 14 divides the forward transmit power TX between the branch terminating at the on-chip termination 18 and the on-chip power sensor 20.

It is to be understood, that in order for the on-chip power sensor 20 to change its resistivity value, a sufficient amount of RF power needs to be forwarded to the on-chip power sensor 20. Consequently, the fraction of transmit power reaching the on-chip termination 18 in FIG. 2A may be substantially lower than the transmit power TX1, TX2 delivered along the first and second transmit paths 11A, 11B.

If one was to implement the on-chip power sensor 20 as the temperature dependent resistor, as explained above, the change in resistance will be a direct measure of transmit power forwarded to the on-chip power sensor 20.

Figure 1:
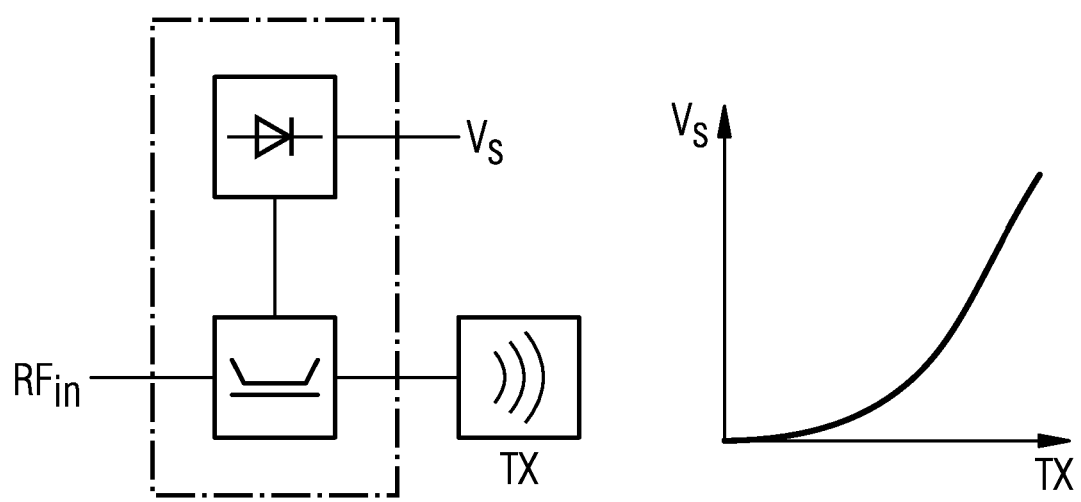
FIG. 1 depicts a calibration scheme for a millimeter-wave transmitter according to the prior art.

It is once again emphasized that the on-chip power sensor 20 provides a direct measure of the portion of the forward (transmit) power TX3 forwarded along the calibration path 11C on the same chip as the millimeter-wave transmitter 1. Different to the prior art, there is no coupling or bridging over an air gap required, as was the case for the calibration setup depicted in FIG. 1 according to the prior art. It is to be noted that the knowledge of the portion of the transmit power forwarded to the on-chip power sensor 20 may be used to calibrate the power estimators 16A, 16B, 16C in order to compensate for variations across individual ones of the power estimator 16A, 16B, 16C, for example implemented as diode-based sensors/estimators.

It is in fact conceivable to improve the estimate provided by the power estimators 16A, 16B, 16C during the operation of the millimeter-wave transmitter 1 with each measurement of the portion of the transmit power within the calibration path 11C.

Figure 2B:
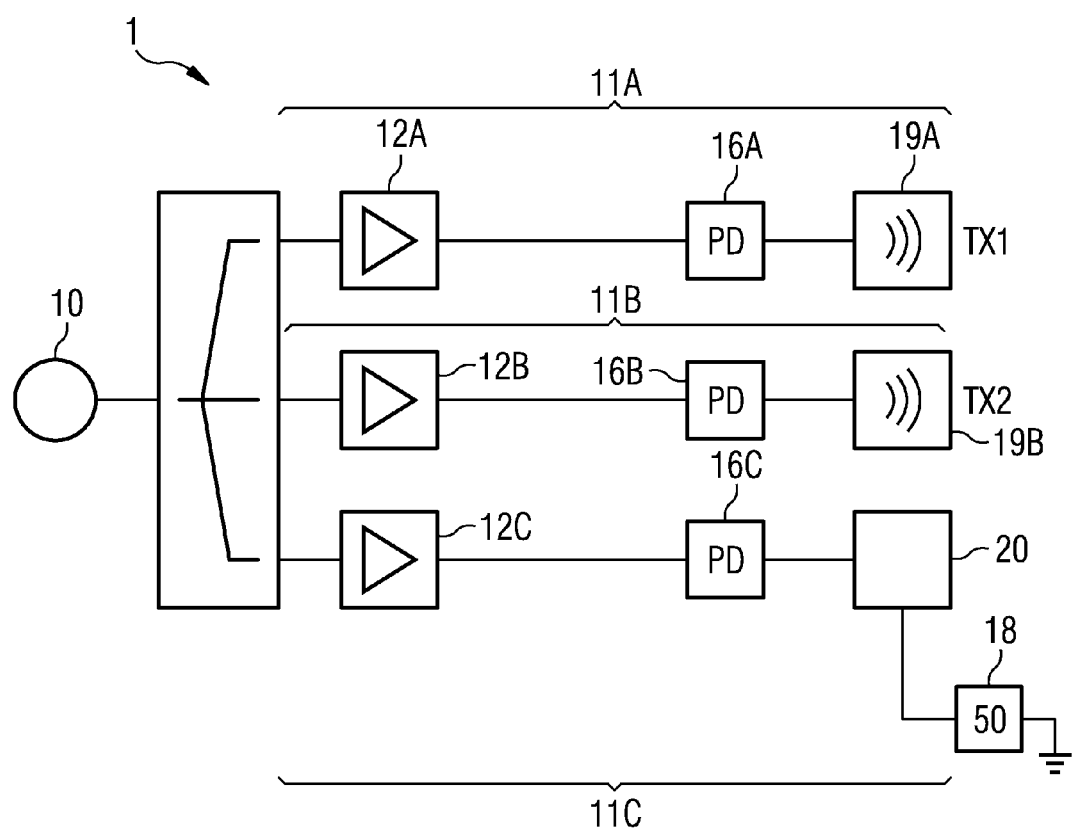
FIG. 2B shows a further embodiment of the millimeter-wave transmitter according to the present invention.

FIG. 2B shows another embodiment of the millimeter-wave transmitter 1 according to the invention. Like elements of the millimeter-wave transmitter 1 shown in FIG. 2B are given identical reference numerals as already explained within FIG. 2A. In FIG. 2B there is no power splitter 14 provided. Instead the amplifier 12C forwards the transmit power to the power estimator 16C and further to the on-chip power sensor 20. The on-chip power sensor 20 is coupled to an on-chip terminator 18 as shown. The on-chip terminator 18 assures that the calibration path 11C is matched to a given impedance, as are the first and second transmit paths 11A, 11B, typically. The embodiment shown in FIG. 2B may be of interest with regard to an insertion loss of the power splitter 14 being omitted in the embodiment of FIG. 2B.

As before, the on-chip power sensor 20 needs to be provided with a sufficiently high RF power, which seems the case, if the RF power transmitted along individual ones of the transmit paths 11A, 11B and the calibration path 11C is high enough for the on-chip power sensor 20 to respond in a timely manner. Such requirements may be solved by appropriately dimensioning the layer forming the temperature dependent resistor which essentially gives the on-chip power sensor 20, as explained above. As explained before, each of the power measurements performed with the on-chip power sensor 20 may be used in order to calibrate the individual power estimators 16A, 16B, 16C, as was explained with regard to FIG. 2A.

FIG. 2C shows yet another embodiment of the millimeter-wave transmitter 1 according to the present invention. Different to the embodiment discussed with regard to FIGS. 2A and 2B, the RF oscillation delivered by the oscillator 10 in FIG. 2C is split into the transmit paths 11A, 11B. Each of the transmit paths 11A, 11B may comprise an individual amplifier 12A, 12B, an individual power estimator 16A, 16B and an antenna element 19A, 19B terminating each one of the transmit paths 11a, 11B.

Each of the transmit paths 11A, 11B in FIG. 2C may further comprise a switch 15A, 15B. The switch 15A, 15B, may be disposed downstream the amplifier 12A, 12B, respectively. The switches 15A, 15B may forward the transmit power from the respective amplifier 12A, 12B to the on-chip power sensor 20, respectively. Once the transmit power from the first transmit path 11A is measured at the on-chip power sensor 20, this power measure may be used to improve an accuracy of the power estimator 16A within the first transmit path 11A and/or the second power estimator 16B.

Under some circumstances it may be of interest to make sure that only the first switch 15A is in a position to forward the transmit power within the first transmit path 11A to the on-chip power sensor 20, while the second transmit path 11B is in the standard forward transmission mode, this is to say the second switch 15B forwards substantially any of the transmit power within the second transmit path 11B to the antenna element 19B. Once the transmit power from the first transmit path 11A is measured at the on-chip power sensor 20, this power measure may be used to improve an accuracy of the power estimator 16A within the first transmit path 11A and/or the second power estimator 16B within the second transmit path 11B.

Likewise under some circumstances it may be of interest to have the second switch 15B in a position to forward the transmit power within the second transmit path 11B to the on-chip power sensor 20, while the first transmit path 11A is in the standard forward transmission mode, this is to say the first switch 15A forwards substantially any of the transmit power within the first transmit path 11A to the antenna element 19A. Once the transmit power from the second transmit path 11B is measured at the on-chip power sensor 20, this power measure may be used to improve an accuracy of the power estimator 16B within the second transmit path 11B and/or the first power estimator 16A within the first transmit path 11A.

If however both switches 15A, 15B are in a position so that the respective transmit power from the first transmit path 11A and the second transmit path 11B is forwarded to the on-chip power sensor 20, care needs to be taken that the measured power value at the on-chip power sensor 20 now corresponds to the total transmit power forwarded along the first transmit path 11A and the second transmit path 11B. As before, the transmit power measured at the on-chip power sensor 20 when forwarding the transmit power within the transmit paths 11A, 11B to the on-chip sensor 20, may be used in order to improve an accuracy of the first power estimator 16A within the first transmit path 11A and/or the second power estimator 16B within the second transmit path 11B.

A person of ordinary skill in the art will readily appreciate that the presence of the switches 15A, 15B may provide for a setup wherein the millimeter-wave transmitter 1 transmits its respective transmit power TX1, TX2 to the antenna elements 19A, 19B during a time period wherein the millimeter-wave transmitter 1 is supposed to transmit. During non-transmitting time periods of a corresponding transmission protocol, the switches 15A and/or 15B, may respectively be set to a position, wherein the respective transmit power TX1 and/or TX2 is being forwarded to the on-chip power sensor 20. The respective transmit power determined in such a non-transmitting period may be used in order to improve a calibration of the power estimator(s) 16A, 16B. Obviously in non-transmitting time periods the respective transmit power TX1 and/or TX2 may be measured individually or in combination, as explained before. Such a setup of the millimeter-wave transmitter 1 may be of interest when operating the transmitter as an array of transmitting antenna elements 19A, 19B.

Alternatively the embodiment of FIG. 2C may be used to measure a transmit power TX1 within the transmit path 11A by directing this transmit power to the on-chip power sensor 20, while the second transmit path 11B is transmitting its respective transmit power TX2, by appropriately switching the switches 15A, 15B. Such a setup may however lead to a millimeter-wave transmitter 1 emitting with an individual one of the antenna elements 19A, 19B at a time, which may reduce the overall transmit power.

Figure 2D:
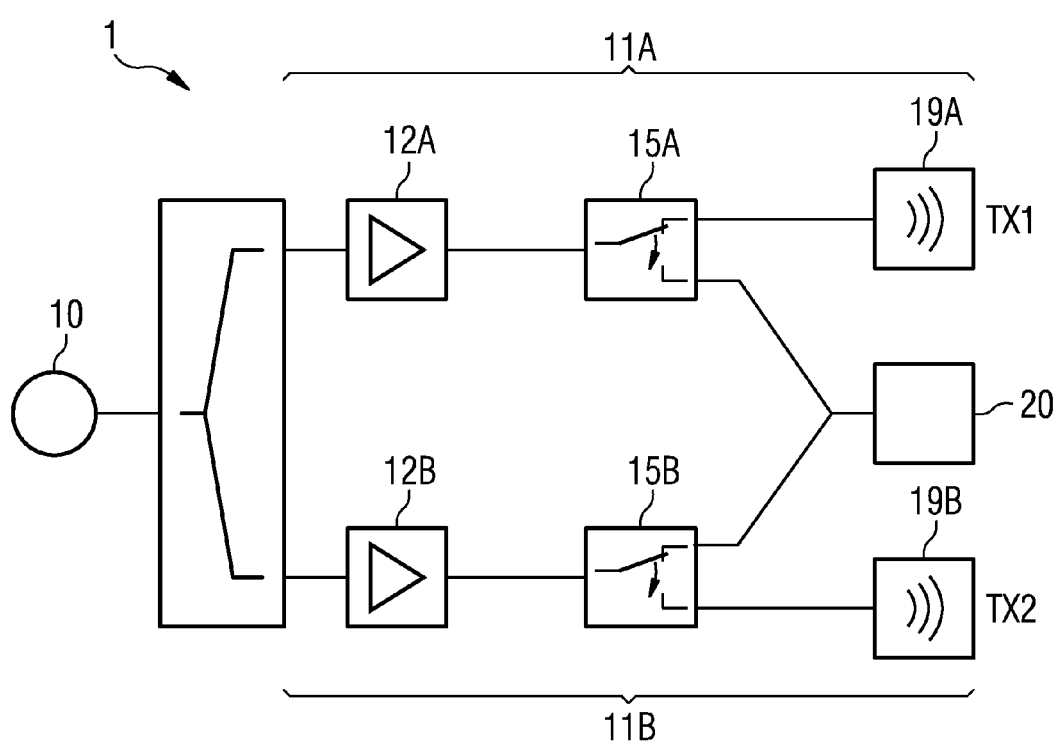
FIG. 2D shows yet another embodiment of the millimeter-wave transmitter according to the present invention.

FIG. 2D shows yet another embodiment of the millimeter-wave transmitter 1. The millimeter-wave transmitter 1 shown in FIG. 2D is slightly different to the millimeter-wave transmitter shown in FIG. 2C, namely the power estimators 16A, 16B are not present within the first transmit path 11A and the second transmit path 11B. It may be sufficient to rely on the on-chip power sensor 20 in order to determine the respective transmit path TX1, TX2, forwarded along the individual transmit paths 11A, 11B. The switches 15A, 15B, shown in the embodiments of the millimeter-wave transmitter 1 of FIGS. 2C and 2D may reach a switching time or rate sufficiently high in order to reliably switch the switches 15A, 15B between periods of transmitting millimeter-wave power and non-transmitting periods according to a protocol the millimeter-wave transmitter 1 is operated with.

Figure 3:
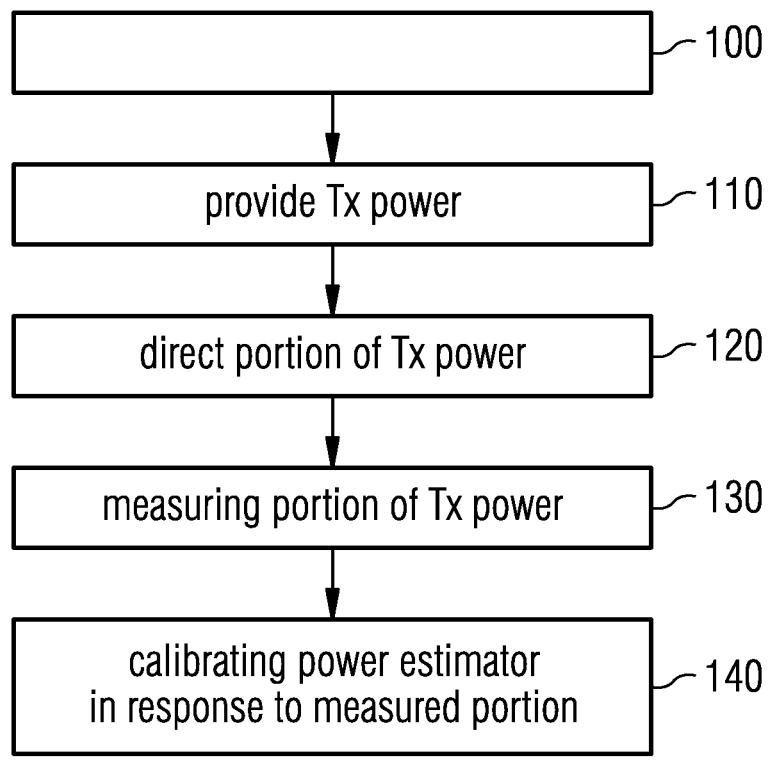
FIG. 3 shows a diagram of a method of calibrating millimeter-wave transmitter according to the present invention.

FIG. 3 depicts a block diagram of a method of calibrating the millimeter-wave transmitter 1 on a chip according to the present invention. The method may comprise a step 110 of providing a transmit power within at least one of the transmit paths 11A, 11B and/or the calibration path 11C. In a step 120 at least a portion of the provided transmit power is directed to the on-chip power sensor 20. The portion of the directed TX power may be determined by the 1:n power splitter downstream the oscillator 10 and/or the power splitter 14 within the calibration path 11C and/or the respective switching position of the switches 15A, 15B, as explained before.

A person of ordinary skill will readily understand that in a set-up of FIGS. 2C and 2D the full transmit power TX1 within the first transmit path 11A and/or the full transmit power TX2 within the second transmit path 11B may be forwarded to the on-chip power sensor 20, if the switches 15A, 15B are set to corresponding switching positions, as was explained above.

The calibration method may further comprise a step 130 of measuring a power of the forwarded portion of the transmit power being forwarded in the directing step 120. The method may further comprise an optional step of calibrating power estimators 16A, 16B, 16C in response to the measured portion of the transmit power.

A person of ordinary skill in the art will readily understand that the directing step 120 may be implemented such that there are time periods wherein substantially the full transmit power within the individual one of the transmit path 11A, and/or 11B is being forwarded to the respective antenna elements 19A, 19B and the millimeter-wave transmitter 1 therefore reaching its full transmit power TX1 and/or TX2 during such time periods. This shall be explained in the context of radar distance measuring systems as a non-limiting example. Similar conditions may exist with protocols used in millimeter-wave transmitters for wire-less communication.

In radar distance measuring systems as a non-limiting example, there may be time periods of the radar transmitter 1 sending transmit power TX1 and/or TX2. Subsequently thereto, there may be time periods of receiving an echo or a response during a receiving period. During the receiving period of a corresponding radar receiver (not shown), the transmit power TX1, TX2 may be diverted, preferably completely to the on-chip power sensor 20, in order to calibrate the transmit power TX1, TX2 delivered over the individual transmit paths 11A, 11B.

Alternatively or additionally in the embodiments of FIGS. 2A and 2B the on-chip termination 18 may be replaced by a third antenna element 19C forwarding not the full transmit power TX1, TX2 as first and second transmit path, but a fraction thereof depending on the ratio the power splitter 14 splits the power between the on-chip power sensor 20 and the portion of the calibration path 11C comprising the power estimator 16C. There may be situations, where a further antenna element 19C is of advantage, even though it will not reach the full transmit power as the first and second transmit path 11A, 11B.

Figure 4A:
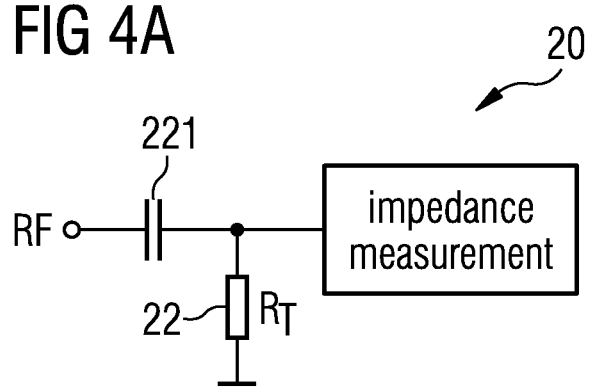
FIG. 4A shows a first embodiment of the on-chip power sensor according to the invention.

FIG. 4A shows a first implementation of an on-chip power sensor 20 for use in a millimeter-wave transmitter 1 as the on-chip power sensor 20 according to the invention. The on-chip power sensor 20 shown in FIG. 4A may be implemented as a resistor 22 formed in a layer of the chip, the resistance of the resistor 22 varying over temperature. A person of ordinary skill in the art will readily appreciate that normally one is interested in substantially eliminating any temperature dependencies in resistivity for layers within the chip. Nevertheless for the purpose of the on-chip power sensor 20 according to the present invention, it may be of interest to provide resistor 22 such that it shows a pronounced temperature dependence of its resistivity, for example a positive temperature dependence or a negative temperature dependence.

In a set-up as shown in FIG. 4A radio frequency entering from the left is coupled via a capacitor 221 to the resistor 22. As the capacitor 221 is substantially invisible to the radio frequency, the RF power is forwarded to the temperature dependent resistor 22 and the change in resistivity may be measured by a standard on-chip impedance measurement.

Figure 4B:
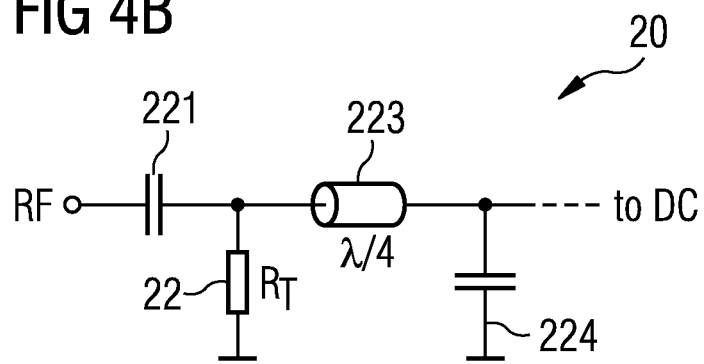
FIG. 4B shows another embodiment of the on-chip power sensor according to the invention.

FIG. 4B shows a further implementation of the on-chip power sensor 20 according to the invention. Again the RF power forwarded to the on-chip power sensor 20 enters from the left via a first capacitor 221 to the resistor 22 as before. Further, a quarter wavelength element 223 is coupled to the resistor 22 in combination with a second capacitor 224. In such a setup a change in resistance of the resistor 22 may be detected by a DC measurement.

Figure 4C:
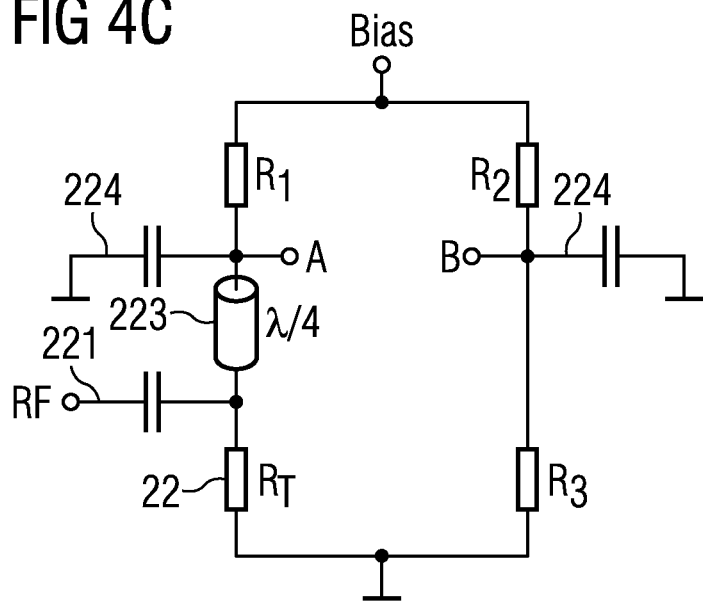
FIG. 4C shows yet another embodiment of the on-chip power detector according to the invention.

FIG. 4C shows another implementation of the on-chip power sensor 20 according to the invention. The change in resistance may be measured as voltage between the terminals A and B. As before, the RF power may enter from the left via the first capacitor 221 and the temperature dependent resistor 22 together with the quarter wavelength element 223 and the second capacitor 224 in combination with a non-temperature dependent resistor R1. A person of ordinary skill will appreciate that the temperature dependent resistor 22, the first capacitor, the quarter wavelength element 223, the second capacitor 224 and the resistor R1 may form a first branch of a balancing bridge, in FIG. 4C the left branch of the balancing bridge, which may be biased using a corresponding bias voltage at the bias terminal Bias.

A right branch of such a balancing bridge may not comprise the temperature dependent resistor 22, the first capacitor, and/or the quarter wavelength element 223. The right branch may however comprise the second capacitor 224 and non-temperature dependent resistances R2 and R3. If now the temperature dependent resistor 22 is to change its resistivity due to a change in temperature caused by RF power deposited in the temperature dependent resistor 22, this will cause an imbalance of the balancing bridge between the left and right branch of the bridge as shown in FIG. 4C. This voltage between the terminals A and B gives a measure of the RF power deposited in the resistor 22 due to temperature dependency of the resistor 22.

Figure 4D:
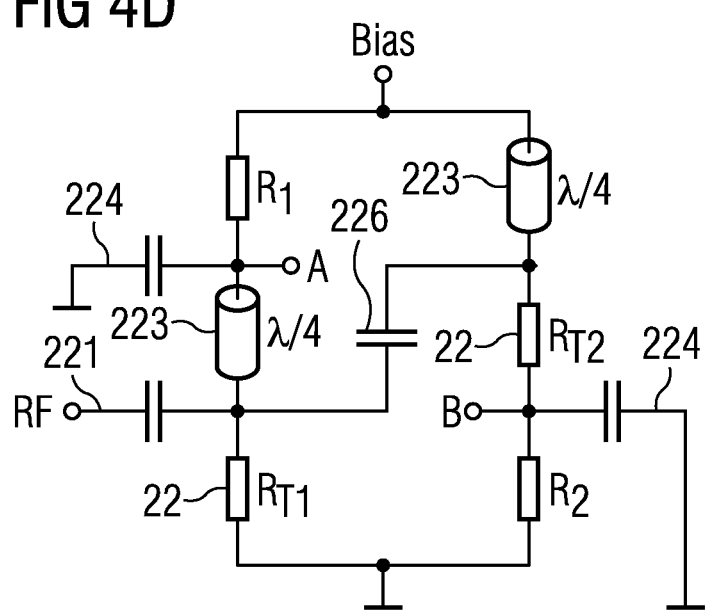
FIG. 4D shows yet another embodiment of the on-chip power detector according to the invention.

FIG. 4D shows yet another implementation of the on-chip power sensor 20 according to the invention. The bridge shown in FIG. 4D is somewhat similar to the balancing bridge shown in FIG. 4C. The RF power now enters the left and the right branch of the bridge via the capacitors 221 and 226, respectively. The quarter wavelength elements 223 and the capacitors 224 form an open for RF while DC components are confronted with a standard bridge circuitry. Therefore, the RF power reaches the temperature dependent resistors 22 only. The bridge shown in FIG. 4D may be of interest in order to increase an accuracy of the bridge compared to the bridge discussed in FIG. 4C. This is due to the resistors 22 in FIG. 4D, shifting the potential at nodes A and B in opposite directions, respectively.

The temperature dependence of resistor 22 within the right branch may be identical to the one of the resistor 22 within the left branch of the bridge. The resistor R2 may however be substantially not temperature-dependent and nominally identical to R1. The further capacitor 224 may be nominally identical to the capacitor 224 within the left branch of FIG. 4D. If now the temperature dependent resistors R22 are to change their resistivity values, this will cause an imbalance within the bridge shown in FIG. 4D. The imbalance will be measurable as a voltage across the terminals A and B. This voltage between the terminals A and B gives a measure of the RF power deposited in the resistors 22 due to the temperature dependency of the resistors 22.

Figure 4E:
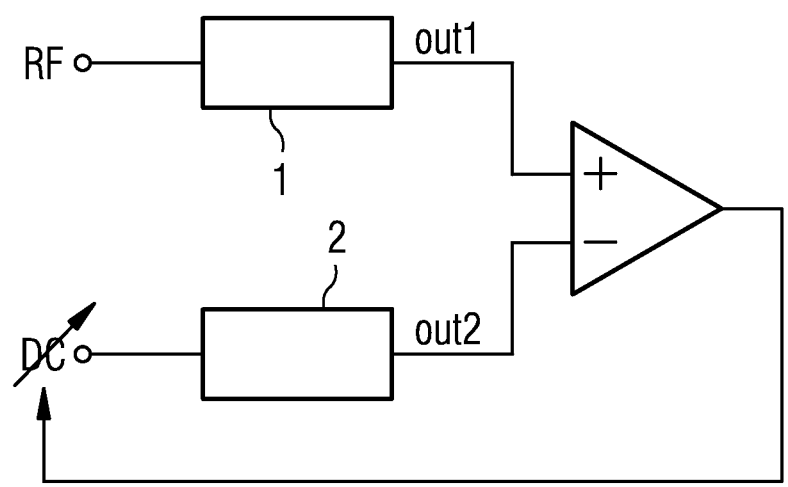
FIG. 4E shows yet another embodiment of the on-chip power sensor according to the invention.

FIG. 4E shows another implementation of an on-chip power sensor 20 wherein the elements 1 and 2 may comprise the temperature dependent resistors, for example in a setup as explained in FIG. 4A, respectively. If the first element 1 receives an RF transmit power a resulting voltage will be present at its output out1. The operational amplifier downstream the elements 1 and 2 may regulate a DC voltage present at the input of the second element 2 until an output out2 of the second element 2 will provide a voltage substantially identical to the voltage present at the first output out1. This is to say that a DC power fed to the second element equals the power of the RF signal fed to the first element 1. The measurement of the DC power applied to the second element 2 is known in the art and shall not be explained any further.

The millimeter-wave transmitter 1 according to the invention, the method of calibrating the RF power transmitted by the millimeter-wave transmitter 1 and the implementations of the on-chip power sensor 20 were explained in some embodiments, these embodiments are to be construed as explaining examples only and in no way to limit the scope of the present invention. A person of ordinary skill will readily understand that individual ones of the embodiments may be combined without departing from the scope of the present invention. Likewise embodiments may comprise some or all of the features explained with regards to the exemplary embodiments disclosed herein.

REFERENCE NUMERALS

1 Millimeter-wave transmitter
10 Oscillator
11A, 11B at least one transmit path
11C Calibration path
12A, 12B, 12C Amplifier
14 Power splitter
16A, 16B, 16C Power estimator
18 On-chip termination
19A, 19B, 19C Antenna element
20 On-chip Power sensor
221 First capacitor
223 Quarter wavelength element
22 Temperature dependent resistor
224 Second capacitor
226 Bridging capacitor

We claim:

1. A millimeter-wave transmitter on a chip comprising:
at least one transmit path of the millimeter-wave transmitter coupleable to an oscillator, the at least one transmit path including an on-chip power estimator to measure at least a portion of a transmit power transmitted over the at least one transmit path; and
a calibration path of the millimeter-wave transmitter coupleable to the oscillator and including an on-chip power sensor configured to measure at least a portion of the transmit power transmitted over the at least one transmit path.

2. The millimeter-wave transmitter on a chip according to claim 1, wherein the on-chip power sensor is coupled to the calibration path via a directional coupler or a power splitter.

3. The millimeter-wave transmitter according to claim 2, wherein the calibration path is terminated by an antenna element or an on-chip termination.

4. The millimeter-wave transmitter according to claim 1, wherein the individual one of the at least one transmit path and/or the calibration path comprises an amplifier.

5. The millimeter-wave transmitter according to claim 1, wherein the oscillator is a voltage controlled oscillator.

6. The millimeter-wave transmitter according to claim 1, wherein a selected one of the at least one transmit path comprises a switch for selectively coupling the selected one of the at least one transmit path to the on-chip power sensor.

7. The millimeter-wave transmitter according to claim 1, wherein the on-chip power sensor is implemented as a layer.

8. The millimeter-wave transmitter according to claim 7, wherein the on-chip power sensor is implemented as a resistor formed on a layer within the chip.

9. The millimeter-wave transmitter according to claim 8, wherein the layer is a layer used to implement at least one base contact layer of a plurality of transistors within the chip.

10. The millimeter-wave transmitter according to claim 8, wherein the layer is a silicide polysilicon layer used to connect the base region of transistors within the chip.

11. The millimeter-wave transmitter according to claim 8, wherein the resistor is a temperature dependent resistor.

12. The millimeter-wave transmitter according to claim 1, wherein the oscillator is arranged on the chip.

13. A method of calibrating a millimeter-wave transmitter on a chip, the method comprising:
providing transmit power within at least one transmit path of the millimeter-wave transmitter, the at least one transmit path including a power estimator;
directing at least a portion of the provided transmit power along a calibration path to a power sensor within the calibration path on the chip; and
measuring the portion of the provided transmit power at the power sensor on the chip.

14. The method according to claim 13, further comprising:
calibrating the power estimator within the at least one transmit path and/or a second power estimator within the calibration path in response to the measured portion.

15. The method according to claim 13, wherein the directing is such that at times the portion of the provided transmit power directed to the power sensor vanishes.

16. An on-chip power sensor coupleable to at least one transmit path of a millimeter-wave transmitter, the on-chip power sensor comprising:
a resistor formed in a layer of the chip, wherein a resistance of the resistor is temperature dependent;
a quarter wavelength element coupled to the resistor; and
a capacitor coupled to the resistor via the quarter wavelength element and in parallel to the resistor,
wherein the on-chip power sensor is configured to measure at least a portion of a transmit power transmitted over the at least one transmit path of the millimeter-wave transmitter.

17. The on-chip power sensor according to claim 16, wherein the resistor is formed by a material deposited within a layer of the chip.

18. The on-chip power sensor according to claim 17, wherein the layer comprises at least one base contact of a plurality of transistors within the chip.

19. The millimeter-wave transmitter according to claim 1, wherein the on-chip power sensor is configured to measure the transmit power at a higher accuracy than the measurement of the transmit power by the on-chip power estimator.

20. The millimeter-wave transmitter according to claim 1, wherein the on-chip power sensor is a temperature dependent resistor and the on-chip power estimator includes a diode.

21. The millimeter-wave transmitter according to claim 1, wherein the calibration path further comprises a second on-chip power estimator configured to measure at least a portion of the transmit power transmitted over the at least one transmit path.

22. The millimeter-wave transmitter according to claim 21, wherein the second on-chip power estimator and the on-chip power estimator within the at least one transmit path are identical.

23. The millimeter-wave transmitter according to claim 21, wherein the second on-chip power estimator and the on-chip power sensor are coupled to the calibration path via a power splitter.

24. The millimeter-wave transmitter according to claim 23, wherein the on-chip power sensor is configured to measure the transmit power transmitted over the at least one transmit path based on a ratio in which the power splitter divides a transmit power on the calibration path between the on-chip power sensor and the second on-chip power estimator.

25. The millimeter-wave transmitter according to claim 1, wherein the least one transmit path and the calibration path are coupleable to the oscillator via a power divider.

* * * * *